(12) United States Patent
Kubo et al.

(10) Patent No.: US 9,481,595 B2
(45) Date of Patent: Nov. 1, 2016

(54) METHOD OF PRODUCING OPTICAL ELEMENT FORMING MOLD AND OPTICAL ELEMENT FORMING MOLD

(75) Inventors: Hiroyuki Kubo, Utsunomiya (JP); Shigeru Hashimoto, Utsunomiya (JP); Keiji Hirabayashi, Komae (JP); Koji Teranishi, Utsunomiya (JP); Yusuke Owaki, Moka (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 817 days.

(21) Appl. No.: 13/643,159

(22) PCT Filed: May 25, 2011

(86) PCT No.: PCT/JP2011/062554
§ 371 (c)(1),
(2), (4) Date: Oct. 24, 2012

(87) PCT Pub. No.: WO2011/152435
PCT Pub. Date: Dec. 8, 2011

(65) Prior Publication Data
US 2013/0056891 A1 Mar. 7, 2013

(30) Foreign Application Priority Data

Jun. 3, 2010 (JP) ................................. 2010-127695
Apr. 11, 2011 (JP) ................................. 2011-087627

(51) Int. Cl.
*B29D 11/00* (2006.01)
*C03B 11/08* (2006.01)
(Continued)

(52) U.S. Cl.
CPC ......... *C03B 11/086* (2013.01); *C23C 14/0605* (2013.01); *C23C 14/325* (2013.01); *G02B 3/04* (2013.01); *C03B 2215/12* (2013.01); *C03B 2215/24* (2013.01); *C03B 2215/72* (2013.01)

(58) Field of Classification Search
None
See application file for complete search history.

(56) References Cited

U.S. PATENT DOCUMENTS 5,008,002 A * 4/1991 Uno et al. ..................... 427/530
5,435,900 A * 7/1995 Gorokhovsky .......... 204/298.41
(Continued)

FOREIGN PATENT DOCUMENTS

CN 101113516 A 1/2008
CN 201158701 Y 12/2008
(Continued)

OTHER PUBLICATIONS

Hirofumi Takikawa et al., "Review of Cathodic Arc Deposition for Preparing Droplet-Free Thin Films," IEEE Transactions on Plasma Science, IEEE Service Center, Piscataway, NJ, US, vol. 35, No. (4) pp. 992-999 (Aug. 2007) (XP011189877).
(Continued)

*Primary Examiner* — Alison L Hindenlang
*Assistant Examiner* — Kimberly A Stewart
(74) *Attorney, Agent, or Firm* — Fitzpatrick, Cella, Harper & Scinto

(57) ABSTRACT

Provided is a method of producing an optical element forming mold, the method including forming a ta-C film 12 on a mold matrix 10 for an optical element forming mold by an FCVA process, in which the mold matrix 10 is kept at a floating potential, a voltage is applied to a mold matrix-holding member 2 for holding the mold matrix via insulating members (3a,3b), and a magnet 4 internally provided in the mold matrix forms a magnetic field for applying a magnetic force in a normal direction of a transfer surface of the mold matrix so as to follow a magnetic force applied by a filter coil 22, thereby homogenizing the film quality.

7 Claims, 3 Drawing Sheets

(51) Int. Cl.
*C23C 14/06* (2006.01)
*C23C 14/32* (2006.01)
*G02B 3/04* (2006.01)

(56) References Cited

U.S. PATENT DOCUMENTS

| | | | |
|---|---|---|---|
| 6,761,805 B1* | 7/2004 | Shi et al. | 204/192.38 |
| 2003/0161969 A1* | 8/2003 | Hilliard | C23C 14/0068 427/571 |
| 2004/0055538 A1* | 3/2004 | Gorokhovsky | 118/715 |
| 2004/0177648 A1 | 9/2004 | Igari et al. | |
| 2007/0037014 A1* | 2/2007 | Nagata | G11B 5/8408 428/800 |
| 2007/0252294 A1* | 11/2007 | Tsuji | 264/1.32 |
| 2009/0291326 A1* | 11/2009 | Nagata | 428/800 |
| 2010/0129615 A1* | 5/2010 | Chizik et al. | 428/189 |

FOREIGN PATENT DOCUMENTS

| | | | |
|---|---|---|---|
| JP | 63-007364 A | 1/1988 | |
| JP | 9-025130 A | 1/1997 | |
| JP | 11-079759 A | 3/1999 | |
| JP | 2004-075529 A | 3/2004 | |
| JP | 2005-336535 A | 12/2005 | |
| JP | 2008-297171 | * 12/2008 | C01B 31/02 |
| JP | 2008-297171 A | 12/2008 | |
| JP | 2010-116295 | * 5/2010 | C03B 11/00 |
| JP | 2010-116295 A | 5/2010 | |

OTHER PUBLICATIONS

Office Action in Chinese Application No. 201180026372.6 (dated Jul. 1, 2014).

Hirofumi Takikawa et al., "Review of Cathodic Arc Deposition for Preparering Droplet-Free Thin Films," IEEE Transactions on Plasma Science, IEEE Service Center, Piscataway, NJ, US, vol. 35, No. (4) pp. 992-999 (Aug. 2007) (XP011189877).

Dongping Liu et al., "Influence of the Incident Angle of Energetic Carbon Ions on the Properties of Tetrahedral Amorphous Carbon (ta-C) Films," A 21(5) J. Vac. Sci. Technol. 1665-1670 (Jul. 2003) (XP012006517).

M.C. Polo et al., "Preparation of Tetrahedral Amorphous Carbon Films by Filtered Cathodic Vaccum Arc Deposition," 9(3-6) Diamond and Related Materials 663-667 (Apr. 2000) (XP004199839).

* cited by examiner

METHOD OF PRODUCING OPTICAL ELEMENT FORMING MOLD AND OPTICAL ELEMENT FORMING MOLD

TECHNICAL FIELD

The present invention relates to a method of producing an optical element forming mold which is used when optical elements such as lenses and prisms are produced by press-forming a glass material.

BACKGROUND ART

A technology for producing lenses by press-forming a glass material without requiring performing a glass-polishing step has eliminated complicated steps that were necessary in conventional methods of producing an optical element forming mold, thereby having enabled easier production of lenses at lower cost. Properties required for a mold material used for such press forming of a glass optical element include excellence in hardness, heat resistance, releasability, mirror finishing property, and the like.

Conventionally, there have been proposed, as a mold material of this kind, many materials such as metal, ceramics, and materials on each of which metal or ceramics are coated. In particular, a mold produced by forming a carbon film such as a diamond-like carbon film, a hydrogenated amorphous carbon film (a-C:H film), a hard carbon film, or a tetrahedral amorphous carbon film (ta-C film) is good in releasability between the mold and glass, and hence the mold has the advantage that fusion-bonding between the carbon film and glass is unlikely to occur.

However, the mold had, in general, low adhesiveness with the carbon film, and after glass press forming operations were repeated more than several hundred times, the carbon film was partially peeled, and hence sufficient formability was not given to the mold occasionally. That is, the mold had a problem with durability, leading to the high cost of a press-formed product. Further, when a desire for press forming of high refractive index glass has been increasing with progress in downsizing of digital cameras and the like, the press forming of high refractive index glass performed at as high a forming temperature as 650° C. or more has involved a big problem in that the mold produced by using any of the diamond-like carbon film, the a-C:H film, and the hard carbon film have poor durability.

Then, there is known, as a carbon film having good heat resistance, a ta-C film obtained by using a filtered cathodic vacuum arc process (FCVA process) as disclosed in Patent Literature 1. A conventional diamond-like carbon film (hard carbon film) produced by using a methane-based gas contains hydrogen atoms, and hence, when the film is formed under high temperature, bonds between a carbon atom and a hydrogen atom are likely to be cut, resulting in graphite bonding ($sp^2$ bonding) between carbon atoms and leading to reduction in the hardness of the film. On the other hand, as the ta-C film is produced by the FCVA process using graphite as a material, it is possible to obtain a hydrogen-free, diamond-like carbon film ($sp^3$ bonding having high strength).

However, according to the above-mentioned method of forming a ta-C film by the FCVA process, while fine particles of a cathode material occurring simultaneously with ion release from a cathode spot are being trapped and removed during plasma-magnetic transportation, only carbon ions are allowed to reach a mold matrix (forming mold substrate), thereby forming a film. The FCVA process described above had the problem that the gradient peripheral portions of the resultant mold had low heat resistance. In particular, the gradient peripheral portions of a mold having a shape with a large angle between principal traces (angle made between the optical axis center of a mold and the normal direction at an optically effective diameter position) were apt to have inferior heat resistance, compared with the top portion of the mold. Thus, the ta-C film became liable to be peeled at the peripheral portions of the mold as the number of press forming increased, resulting in degradation of durability.

CITATION LIST

Patent Literature

PTL 1: Japanese Patent Application Laid-Open No. 2004-075529

SUMMARY OF INVENTION

Technical Problem

An object of the present invention is to provide a method of producing an optical element forming mold by which an optical element forming mold including a ta-C film with a uniform quality from the top portion of the mold up to the peripheral portions of the mold can be produced.

Solution to Problem

In order to solve the above-mentioned problem, the present invention provides a method of producing an optical element forming mold for press-forming an optical element, the method including: disposing a mold matrix for the optical element forming mold in a film-forming chamber while keeping the mold matrix at a floating potential; forming a magnetic field in a normal direction with respect to a film-forming surface of the mold matrix; and forming a tetrahedral amorphous carbon film on the film-forming surface of the mold matrix by using a filtered cathodic vacuum arc process while applying a voltage to a holding member for holding the mold matrix.

Advantageous Effects of Invention

By forming a ta-C film by using the FCVA process described above, it is possible to prevent the quality of the film from degrading at the peripheral portions of the mold, resulting in the formation of a ta-C film having a uniform quality. As a result, the press forming durability times of the optical element forming mold can be increased, thereby being able to reduce significantly the production cost of an optical element.

Further features of the present invention will become apparent from the following description of exemplary embodiments with reference to the attached drawings.

DESCRIPTION OF EMBODIMENTS

First Embodiment

Figure 1A:
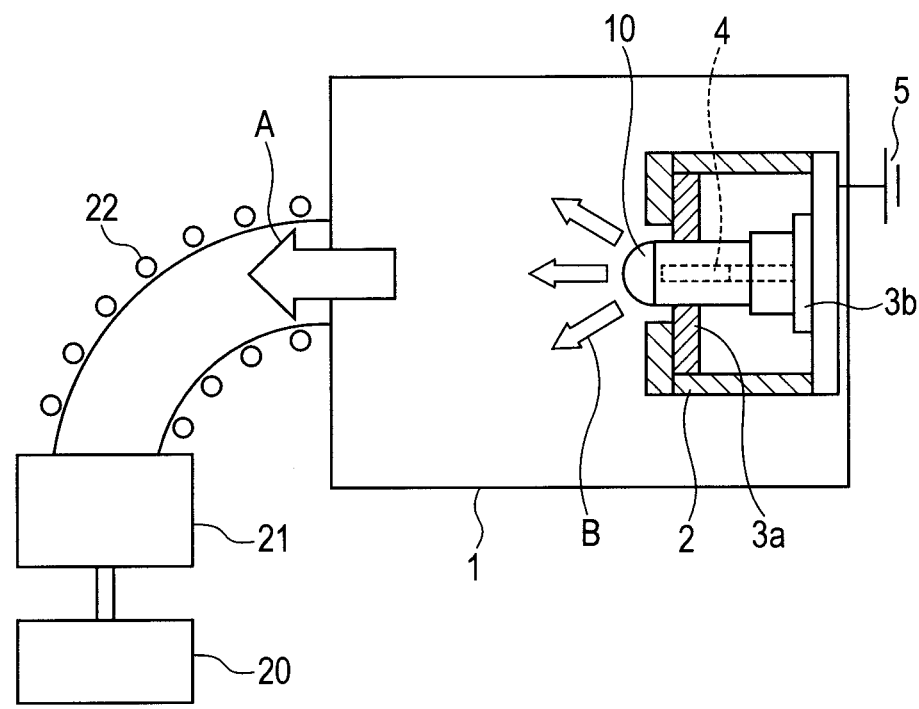
FIG. 1A is a schematic view of a film-forming apparatus in a first embodiment.

FIG. 1A illustrates a film-forming apparatus (FCVA apparatus) which is used in a film-forming step by a filtered cathodic vacuum arc process (FCVA process) in a method of producing an optical element forming mold according to one embodiment. The apparatus includes a mold matrix-holding member 2 in a vacuum chamber 1, and the mold matrix-holding member 2 holds a mold matrix 10 via insulating members 3a and 3b. The mold matrix 10 includes internally a magnet 4, which is a magnetic unit necessary for forming a magnetic field for applying a magnetic force in a normal direction (arrow B) with respect to a film-forming surface (transfer surface) of the mold matrix 10. Connected to the vacuum chamber 1 are a vacuum arc power source 20, an arc plasma generation chamber 21, and a filter coil 22 for forming a tetrahedral amorphous carbon film (ta-C film) by the FCVA process. The FCVA apparatus includes, other than the filter coil, a scanning coil (not shown) used for orienting carbon ion beams.

The direction of the magnetic lines of force of the magnetic field formed by the filter coil 22 is adjusted so as to be along the direction (arrow A) from the mold matrix 10 toward the filter coil 22. When the direction of the magnetic lines of force is set to the reverse direction, carbon ions are dispersed by the influence of magnetic fields in directions different from the moving directions of the carbon ions at the inflection point between the magnetic field formed by the filter coil 22 and the magnetic field formed by the magnet 4, thereby inhibiting the homogenization of a film.

Further, the directions of the magnetic lines of force may be any directions as long as the angle made between each of the directions of the magnetic lines of force formed with respect to the film-forming surface (transfer surface) of the mold matrix 10 and each normal direction (arrow B) is in the range of ±30°. When the magnetic lines of force are formed in the direction out of the range of ±30° with respect to the normal direction, film-forming experiments and simulation analyses show that the homogenization of film thickness and the durability of a formed film degrade. This is probably because the directions of the magnetic lines of force are largely slanted with respect to each normal direction of the transfer surface, and the angle of incidence of generated plasma to the transfer surface becomes too broad, resulting in the damage of the film.

In order to adjust the magnetic flux into the above-mentioned angle range, it is recommended that the size and distance from the surface of the mold of magnet 4 be adjusted in consideration of the directions of the generated magnetic lines of force, the directions varying depending on the value of the voltage applied to the mold matrix-holding member 2.

Further, a DC power source 5 for applying a voltage to the mold matrix-holding member 2 is connected to the apparatus so that the potential of the mold matrix-holding member 2 is a positive potential higher by 5 volts or more and less than 200 volts than the potential of the mold matrix 10, which is kept at a floating potential by the insulating members 3a and 3b.

Next, a film-forming step carried out for forming a ta-C film by using this apparatus is described below. A mold matrix for an optical element forming mold is disposed in a film-forming chamber while the potential of the mold matrix is being kept at a floating potential. The vacuum chamber 1 is evacuated by a vacuum pump (not shown) until the ultimate vacuum in the vacuum chamber 1 reaches $1 \times 10^{-5}$ Pa or less. Next, a carbon plasma is generated by the vacuum arc power source 20 in the arc plasma generation chamber 21, and a desired electric current is controlled by the filter coil 22 so that fine particles of a cathode material occurring simultaneously with ion release from a cathode spot are trapped and removed. Thus, only carbon ions are selected and reach the mold matrix 10. At this time, the carbon ions are attracted along the above-mentioned magnetic lines of force of the magnet 4, that is, from the directions in the range of ±30° with respect to the normal direction of the transfer surface. Further, by the influence of the electric field provided by the mold matrix-holding member 2 to which a potential is applied so as to have a positive potential higher than the potential of the mold matrix 10, the plasma flow is separated into carbon ions and electrons. The separated carbon ions attract electrons distantly from the mold matrix-holding member 2 and keep other carbon ions away from themselves, turning the moving directions of those carbon ions toward the mold matrix 10. Thus, those carbon ions become likely to be incident in the normal direction of the transfer surface having a large angle between principal traces, and as a result, the homogenization between the film at the top portion of the mold and the film at the peripheral portions of the mold can be attained. Thus, a ta-C film having a thickness of 50 to 1,000 nm is uniformly formed.

Note that, when the magnet 4 is provided at an outer portion of the mold matrix 10 or at a side opposite to the transfer surface of the mold matrix 10 instead of providing the magnet 4 inside the mold matrix 10, the same effect can be also obtained.

Figure 1B:
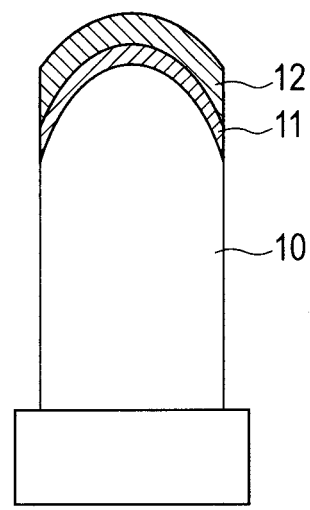
FIG. 1B is a cross-sectional view of an optical element forming mold in the first embodiment.

FIG. 1B illustrates an optical element forming mold on which a film has been formed by using the film-forming apparatus illustrated in FIG. 1A. In the optical element forming mold, a mold matrix 10 made of a cemented carbide containing WC as the main component has formed thereon an SiC layer 11 by using a sputtering apparatus. The SiC layer 11 is an intermediate layer for improving adhesiveness necessary for, as described below, forming a ta-C film 12 on the cemented carbide. A sputtering process is applied as a method of forming the SiC layer 11.

The mold matrix 10 in this embodiment is not limited to the cemented carbide containing WC as the main component, and a mold matrix produced by forming an SiC layer on an SiC sintered compact by a CVD process may be used. In that case, a ta-C film is formed directly on the mold matrix by the FCVA process. Further, although a sputtering film-forming process was used as a method of forming an SiC layer in this embodiment, another film-forming process such as a plasma source ion implantation process (PSII process) may be used. Alternatively, an Ti layer or an TiAlN layer may be formed on a mold matrix 10 by the sputtering film-forming process, followed by formation of the above-mentioned SiC layer 11 on that layer.

EXAMPLE 1

In Example 1, the optical element forming mold illustrated in FIG. 1B was coated. A cemented carbide containing WC as the main component is used as a mold matrix 10, and its forming surface has a convex shape and an angle between principal traces of 55°.

First, a sputtering apparatus (not shown) was used to form an SiC layer 11 having a thickness of 60 nm on a mold matrix 10. Next, the mold matrix 10 was conveyed into a vacuum chamber 1 illustrated in FIG. 1A and was disposed there. After the mold matrix 10 was disposed, a filter coil 22 and a magnet 4 disposed in the mold matrix 10 were used to form a magnetic field toward the normal directions of the transfer surface of the mold matrix 10. A mold matrix-holding member 2 was insulated from the mold matrix 10 and the magnet 4, and a predetermined potential was applied to the mold matrix-holding member 2.

The magnetic flux density of the magnetic field formed was set to −0.003, +0.003, +0.004, +0.015, and +0.0016 tesla, the applied voltage to the mold matrix-holding member 2 was set to −10, ±0, +10, +50, and +100 volts, and a ta-C film 12 having a thickness of 200 nm was formed.

The optical element forming mold produced by forming the ta-C film 12 was used to carry out the press forming of optical lenses, which are optical elements, continuously at 2000 shots. Glass used for the forming was borosilicate-based glass containing a rare earth (Tg: 610° C., refractive index: 1.85), and the conditions for the forming were under a nitrogen atmosphere and at a press temperature of 700° C. Table 1 shows the results.

TABLE 1

| Volt | Tesla | | | | |
|---|---|---|---|---|---|
| | −0.003 | +0.003 | +0.004 | +0.015 | +0.016 |
| −10 | — | — | x | x | — |
| ±0 | — | — | x | x | — |
| +10 | x | x | Good | Good | x |
| +50 | x | x | Good | Good | x |
| +100 | x | x | Good | Good | x |
| +105 | — | — | x | x | — |

As is seen from Table 1, when the magnetic flux density was +0.004 or +0.015 and the applied voltage was +10, +50, or +100, the releasability between the mold and the optical element formed was "good", showing that press forming was carried out without any fusion-bonding defect or any film peeling defect. Further, in each of the cases, the ratio of the film thickness at a portion of an angle between principal traces of 55° of the mold to the film thickness at the top portion of the mold was in the range of 0.8 to 1.0. In addition, when the resistivity of the film was measured at the above-mentioned measurement positions, the results were found to be $10^{11}$ to $10^{12}$ Ω·cm at the top portion and $10^{9.7}$ to $10^{11.8}$ Ω·cm at the portion of an angle between principal traces of 55° of the mold. Thus, both the film thickness and the film quality were found to be uniform.

When the magnetic flux density was −0.003, +0.003, or +0.016 and the applied voltage was +10, +50, or +100, a poor demolding phenomenon was observed at the time of forming, and the durability of the film of the mold was 500 shots or less, provided that the fusion-bonding phenomenon between the mold and glass was included in the poor demolding phenomenon. In each of the cases, the ta-C film was partially peeled at peripheral portions of the mold. When the magnetic flux density was +0.004 or +0.015 and the applied voltage was −10, ±0, or +105, a similar poor demolding phenomenon was also observed at the time of forming, and the durability of the film of the mold was 500 shots or less, provided that the fusion-bonding phenomenon between the mold and glass was included in the poor demolding phenomenon. In each of the cases, the ta-C film was partially peeled at peripheral portions of the mold.

Further, when the magnetic flux density was −0.003, +0.003, or +0.016 and the applied voltage was −10, ±0, or +105, a satisfactory film was not formed, and hence press forming was not able to be carried out.

EXAMPLE 2

A ta-C film having a thickness of 200 nm was formed on a mold matrix having a convex shape and an angle between principal traces of 45° by using the same FCVA apparatus as that in Example 1. Note that an SiC layer as an intermediate layer was formed so as to have a thickness of 60 nm by using a sputtering apparatus as in Example 1.

The magnetic flux density of the magnetic field formed was set to −0.003, +0.003, +0.004, +0.015, and +0.0016 tesla, the applied voltage to the mold matrix-holding member 2 was set to −10, ±0, +10, +50, and +100 volts, and a ta-C film 12 having a thickness of 200 nm was formed.

Next, the optical element forming mold produced by forming the ta-C film 12 was used to carry out the press forming of optical lenses, which are optical elements, continuously at 800 shots in the same manner as in Example 1. Table 2 shows the results.

TABLE 2

| Volt | Tesla | | | | |
|---|---|---|---|---|---|
| | −0.003 | +0.003 | +0.004 | +0.015 | +0.016 |
| −10 | x | x | x | x | x |
| ±0 | x | x | x | x | x |
| +10 | x | Good | Good | Good | x |
| +50 | x | Good | Good | Good | x |
| +100 | x | Good | Good | Good | x |
| +105 | x | Good | Good | x | x |

As is seen from Table 2, when the magnetic flux density was +0.003 or +0.004 and the applied voltage was +10, +50, +100, or +105, the releasability between the mold and the optical element formed was "good", showing that press forming was carried out without any fusion-bonding defect or any film peeling defect. In addition, when the magnetic flux density was +0.015 and the applied voltage was +10, +50, or +100, the releasability between the mold and the optical element formed was "good", showing that press forming was carried out without any fusion-bonding defect or any film peeling defect. Further, in each of the cases, the ratio of the film thickness at a portion of an angle between principal traces of 45° of the mold to the film thickness at the top portion of the mold was in the range of 0.8 to 1.0. In addition, when the resistivity of the film was measured at the above-mentioned measurement positions, the results were found to be $10^{11}$ to $10^{12}$ Ω·cm at the top portion and $10^{9.7}$ to $10^{11.8}$ Ω·cm at the portion of an angle between principal traces of 45° of the mold. Thus, both the film thickness and the film quality were found to be uniform.

Further, when a film was formed under other conditions than the above-mentioned conditions, the durability of the film of the mold was 500 shots or less, provided that the fusion-bonding phenomenon between the mold and glass was included in the poor demolding phenomenon. In this case, the ta-C film was partially peeled at peripheral portions of the mold.

Second Embodiment

Figure 2:
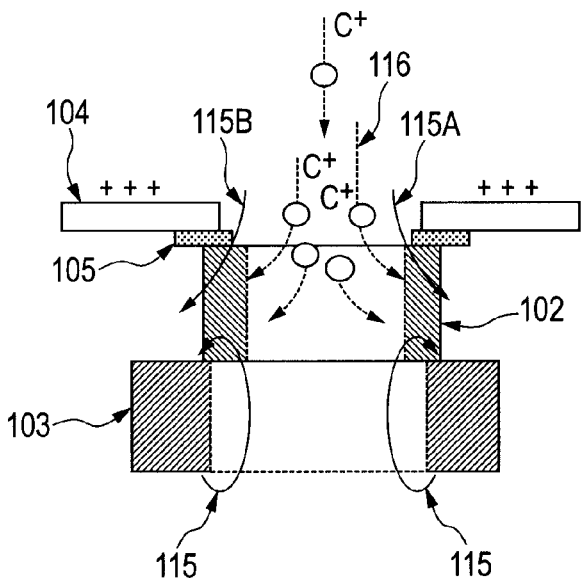
FIG. 2 is a schematic view illustrating how a film is formed on a ring-shaped mold in a second embodiment.

In a second embodiment, in place of the optical element forming mold having a convex shape in the first embodiment, an optical element forming mold having a ring shape (ring-shaped mold) is used. FIG. 2 illustrates how a ta-C film is formed on the inner wall of a mold matrix 102 for a ring-shaped mold. The mold matrix 102 for a ring-shaped mold is arranged so that its aperture surface is perpendicular to a plasma flow (carbon ions and electrons). Further, there is arranged a ring magnet 103 at a side opposite to the side of the plasma flow with respect to the aperture surface of the mold matrix for a ring-shaped mold. In this case, by the influence of an electric field provided by the holding member 104 to which a potential is applied so as to have a positive potential, the plasma flow is separated to carbon ions and electrons. Incidentally, the holding member 104 holds a ring-shaped mold 102 through an insulating member 105. The electrons are attracted to the holding member 104 side, and the moving directions of the carbon ions are turned toward the mold matrix 102 for a ring-shaped mold. The carbon ions are attracted to the inner wall of the mold matrix for a ring-shaped mold along the magnetic lines of force 115A and 115B of the ring magnet 103. Owing to the mechanism described above, the carbon ions become likely to be incident into the inner wall of the mold matrix for a ring-shaped mold. As a result, a ta-C film can be formed on the inner wall of the mold matrix for a ring-shaped mold.

In this embodiment, the voltage is applied to the holding member 104. The reason for applying the voltage of +10 V or more and +100 V or less to the member positioned in the vicinity of the forming mold matrix is that the moving directions of carbon ions which are going to reach other portions than the mold matrix for a ring-shaped mold are turned toward the mold matrix 102 for a ring-shaped mold by the effect of the electric field so that the carbon ions become likely to be incident into the mold matrix for a ring-shaped mold, thereby promoting the formation of the ta-C film on the inner wall of the mold matrix for a ring-shaped mold. At this time, when the applied voltage is less than +10 V, the effect of turning the moving directions of the carbon ions becomes smaller. When the applied voltage is more than +100 V, the effect of repelling carbon ions becomes larger and the amount per se of the carbon ions flowing toward the mold matrix becomes smaller, and hence a satisfactory film-forming speed is not attained in some cases. In this embodiment, a positive voltage was applied to the entire holding member 104. However, the configuration of embodiments is not limited thereto, and there may be adopted a configuration in which a positive voltage can be applied only to part of the holding member 104, the part being close to the mold matrix.

Further, the mold matrix for a ring-shaped mold is kept at a floating potential or a voltage of −100 V or more and −10 V or less is applied to the mold matrix for a ring-shaped mold. This is because carbon ions become likely to be incident into the mold matrix for a ring-shaped mold, thereby attempting to promote the formation of the ta-C film on the inner wall of the mold matrix for a ring-shaped mold. When the applied voltage is larger than −10 V, the effect of attracting carbon ions into the mold matrix becomes smaller, and when the applied voltage is less than −100 V, ion bombardment becomes larger, resulting in the degradation of the film quality in some cases. Further, when the mold matrix for a ring-shaped mold is kept at a floating potential, a self-bias of about minus several tens of voltages is produced depending on the plasma density of a plasma flow at the time of film formation, thereby providing a similar effect in some cases.

Further, the optimal value of the magnetic flux density of the magnetic field formed by the ring-shaped magnet 103 varies depending on the shape (inner diameter and height) of the ring-shaped mold and the range of an effective forming surface. For example, when a ring-shaped mold having an inner diameter of 20 mm and a height of 18 mm is used, the density of the magnetic flux perpendicular to the aperture surface of the ring-shaped mold is set to 0.002 tesla or more and less than 0.02 tesla in the vicinity of the aperture surface and is set to 0.02 tesla or more and less than 0.2 tesla in the vicinity of the effective forming surface in the inner space of the ring-shaped mold. Further, the density Ba of the magnetic flux in the direction perpendicular to the inner wall surface of the mold matrix for a ring-shaped mold (direction horizontal to the aperture surface) and the density Bb of the magnetic flux in the direction perpendicular to the aperture surface desirably have a relationship represented by 0.4Bb<Ba<2Bb.

The magnet is arranged so that the density of the magnetic flux perpendicular to the aperture surface of the mold matrix for a ring-shaped mold is higher in the inner space of the mold matrix for a ring-shaped mold than in the vicinity of the aperture surface. This is because the effect of attracting ions into the inner space of the mold matrix for a ring-shaped mold is enhanced. Further, when the density of the magnetic flux in the direction perpendicular to the inner wall surface of the mold matrix for a ring-shaped mold is two times or more the density of the magnetic flux in the direction perpendicular to the aperture surface, the effect of attracting ions from an ion flow into the inner space of the mold matrix for a ring-shaped mold becomes small. When the density of the magnetic flux in the direction perpendicular to the inner wall surface of the mold matrix for a ring-shaped mold is 0.4 times or less the density of the magnetic flux in the direction perpendicular to the aperture surface, the effect of transferring carbon ions that have penetrated into the inner space of the mold matrix for a ring-shaped mold, to the inner wall of the mold matrix for a ring-shaped mold, becomes small.

The method described above is used to form a ta-C film having a thickness of 20 to 500 nm on the mold matrix 102 for a ring-shaped mold, thereby being able to use the resultant mold as an optical element forming ring-shaped mold.

Figure 3A:
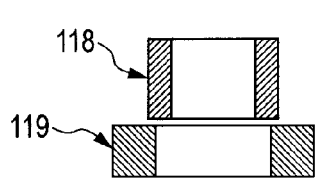
FIG. 3A is a schematic view illustrating the position of the ring-shaped mold and the position of a ring-shaped magnet in the second embodiment.
Figure 3B:
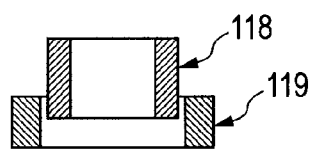
FIG. 3B is a schematic view illustrating the position of the ring-shaped mold and the position of a ring-shaped magnet in the second embodiment.
Figure 3C:
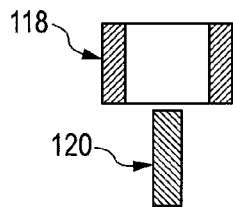
FIG. 3C is a schematic view illustrating the position of the ring-shaped mold and the position of a ring-shaped magnet in the second embodiment.
Figure 3D:
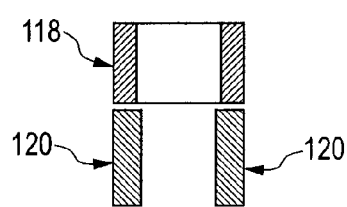
FIG. 3D is a schematic view illustrating the position of the ring-shaped mold and the position of a ring-shaped magnet in the second embodiment.
Figure 3E:
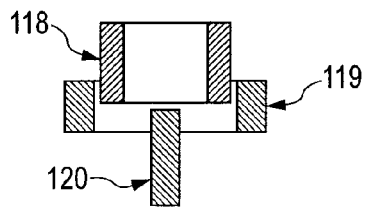
FIG. 3E is a schematic view illustrating the position of the ring-shaped mold and the position of a ring-shaped magnet in the second embodiment.

Note that, in this embodiment, the ring-shaped magnet was arranged on the back side of the mold matrix for a ring-shaped mold as illustrated in FIG. 3A, but the arrangement and size of a magnet are not limited to those in this embodiment. There may be adopted a structure in which part of a mold matrix for a ring-shaped mold is incorporated into the inside of a ring-shaped magnet as illustrated in FIG. 3B. Alternatively, it is also possible to arrange one or a plurality of bar-shaped magnets as illustrated in FIGS. 3C and 3D, or to combine a ring-shaped magnet with a bar-shaped magnet as illustrated in FIG. 3E.

The materials of magnets that are used in the present invention are not particularly limited, and a neodymium magnet, a ferrite magnet, a samarium-cobalt magnet, an alnico magnet, an electromagnet, and the like can be used depending on the density and shape of the magnetic flux to be required.

Further, according to the present invention, a ta-C film having high hardness and heat resistance can be formed on the inner wall surface of a member having a ring shape, and hence the present invention can be applied, not only to an optical element forming ring-shaped mold, but also to various kinds of wear resistant members each having a ring shape. The present invention can be also used, for example, for a guide bush that is used at the inner wall surface of a piston cylinder and for lathe processing, and for a drawing die that is used when drawing processing is carried out by press.

Figure 4:
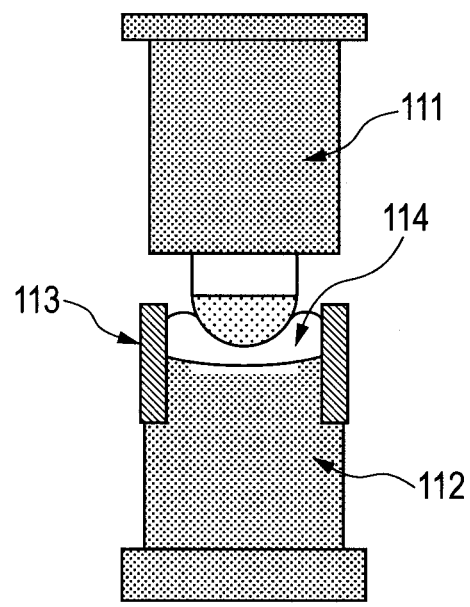
FIG. 4 is a cross-sectional view illustrating how press forming is performed with the ring-shaped mold in the second embodiment.
Figure 5A:
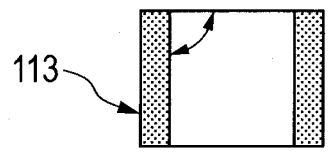
FIG. 5A is a cross-sectional view illustrating a shape of the ring-shaped mold in the second embodiment.
Figure 5B:
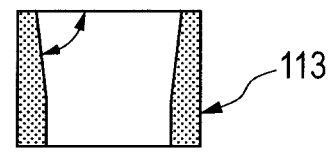
FIG. 5B is a cross-sectional view illustrating a shape of the ring-shaped mold in the second embodiment.

FIG. 4 is a schematic cross-sectional view illustrating how an optical element is press-formed by using a ring-shaped mold on which a ta-C film has been formed as described above. FIG. 4 is an example illustrating how the ring-shaped mold is used at the time of producing a convex meniscus-shaped lens. When an upper mold 111 having a convex shape and a lower mold 112 having a concave shape are used to form a glass member 114, a ring-shaped mold 113 can be used to regulate the outer periphery of the glass member. In the ring-shaped mold 113 in this embodiment, each inner wall has a vertical) (90°) angle with respect to the aperture portion as illustrated in FIG. 5A. However, there may be adopted a ring-shaped mold having a structure in which each inner wall has an acute angle (such as 70° or 80°) with respect to the aperture portion as each inner wall 113' illustrated in FIG. 5B does.

EXAMPLE 3

First, a ring-shaped mold matrix made of a cemented carbide containing WC as the main component was disposed so as to be held by the holding member 104 illustrated in FIG. 2 in the FCVA film-forming apparatus illustrated in FIG. 1A. The ring-shaped magnet 103 is arranged on the back side (side opposite to a plasma flow) of the ring-shaped mold matrix. The density of the magnetic flux perpendicular to the aperture surface of the ring-shaped mold matrix was 0.01 tesla in the vicinity of the aperture surface, and 0.03 tesla in the vicinity of the effective forming surface in the inner space of the ring-shaped mold matrix. The density of the magnetic flux in the direction perpendicular to the inner wall surface of the ring-shaped mold matrix (direction horizontal to the aperture surface) was 0.008 tesla in the vicinity of the aperture surface, and 0.02 tesla in the vicinity of the effective forming surface in the inner space of the ring-shaped mold matrix. Further, a DC power source was used to apply a potential to the holding member 104 so that the holding member 104 has a potential of +35 V. After that, the arc power source 20 was used to generate arc discharge from a graphite target, and the generated carbon ions were transferred to the vacuum chamber 1, thereby forming a ta-C film having a thickness of 50 nm on the inner wall of the ring-shaped mold matrix in the vicinity of the aperture portion.

Note that a sample film for analysis was produced under the same conditions as the above-mentioned film-forming conditions, and the resistivity of the film was measured as a method of evaluating its quality. As a result, the resistivity was $10^9$ $\Omega \cdot cm$ in the vicinity of the aperture surface and $10^{8.5}$ $\Omega \cdot cm$ in the vicinity of the effective forming surface in the inner space of the ring-shaped mold, and hence it was found that the sample film had a high resistivity and had uniform quality. Note that the reason why the resistivity of the film was measured to evaluate the film quality is based on the finding that a ta-C film having high hardness and good heat resistance has high insulating property, but when the film quality degrades and a graphite-like component increases in the film, the resistivity becomes smaller.

Next, a sputtering apparatus was used to form an SiC layer 11 having a thickness of 50 nm on the optical element forming surface side of each of the mold matrices 111 and 112 (upper mold and lower mold) each made of a cemented carbide containing WC as the main component. After that, an FCVA apparatus including a regular-type holding member which has no mechanism for applying an electric field and a magnetic field was used to form a ta-C film having a thickness of 150 nm on each optical element forming surface side.

Next, the above-mentioned optical element forming molds and ring-shaped mold were used to carry out the press forming of optical lenses continuously at 500 shots. Glass used for the forming was borosilicate-based glass containing a rare earth (Tg: 610° C., refractive index: 1.85), and the conditions for the forming were under a nitrogen atmosphere and at a press temperature of 680° C. As a result of the forming, the releasability between the ring-shaped mold and each optical element formed was good, and the press forming was carried out without any fusion-bonding defect or any film peeling defect.

Note that, in the examples of the present invention, the cemented carbide containing WC as the main component was used for the ring-shaped mold matrix, but an SiC sintered compact, various kinds of ceramics sintered compacts, heat resistant alloys, and the like can be also used.

COMPARATIVE EXAMPLE 1

An optical element forming mold was produced by forming a ta-C film on a ring-shaped mold matrix in the same manner as that in Example 1, except that a magnet was not inserted into a holding member in which the ring-shaped mold matrix was disposed and the holding member and the mold matrix were set to a ground potential. In this case, when the ta-C film was formed in the same film-forming time as that in Example 1, the film thickness of the inner wall of the resultant ring-shaped mold in the vicinity of the aperture portion was about one fourth the thickness of the film obtained in Example 1. Thus, the film-forming time was extended by four times, to thereby form a ta-C film having a thickness of about 50 nm.

Note that a sample film for analysis was produced under the same conditions as the above-mentioned film-forming conditions, and the resistivity of the film was measured as a method of evaluating its quality. As a result, the resistivity was $10^4$ $\Omega \cdot cm$ in the vicinity of the aperture surface and $10^3$ $\Omega \cdot cm$ in the vicinity of the effective forming surface in the inner space of the ring-shaped mold, and hence it was found that the sample film had a low resistivity. Further, an upper mold and a lower mold were produced in the same manner as that in Example 1.

Next, the above-mentioned optical element forming molds and ring-shaped mold were used to carry out the press forming of optical lenses continuously at 500 shots as a target shot number. Glass used for the forming was borosilicate-based glass containing a rare earth (Tg: 610° C., refractive index: 1.85), and the conditions for the forming were under a nitrogen atmosphere and at a press temperature of 680° C. As a result of the forming, film peeling occurred from the vicinity of the aperture portion of the ring-shaped mold at 140 shots. After that, the ring-shaped mold and the glass used for the forming were melt-bonded, causing a fusion-bonding defect of glass and a crack defect of formed products.

EXAMPLES 4 TO 13 AND COMPARATIVE EXAMPLES 2 TO 6

Each optical element forming ring-shaped mold was produced by forming a ta-C film on a ring-shaped mold matrix in the same manner as that in Example 1, except that a method of arranging a magnet, the magnetic flux density in the ring-shaped mold, the potential of the mold holding member, and the potential of the mold matrix were changed variously. Then, each press forming test was carried out. Note that the method of arranging a magnet is represented by the reference signs illustrated in FIG. 2. Note that the magnetic flux density is a value of a magnetic flux in the direction perpendicular to the aperture surface. Further, the magnetic flux density in the direction perpendicular to the inner wall surface (direction parallel to the aperture surface) was in the range of 40% to 200% of the value of a magnetic flux in the direction perpendicular to the aperture surface under the conditions of magnet arrangement in those examples. A film-forming time was appropriately adjusted so that a ta-C film had a thickness of about 50 nm. Table 3 shows the magnetic flux density at the aperture portion, the magnetic flux density in the inner space of the mold, the voltage of the mold holding member, and the potential of the mold matrix, whether the resistivity of the ta-C film is high or low, and whether the durability for forming is good or bad.

Note that, in the examples of the present invention, the resistivity in the vicinity of the aperture portion was measured, and the evaluation criteria for the resistivity were defined as follows. That is, a film having a resistivity of less than $10^5$ Ω·cm was represented by Symbol ×, a film having a resistivity of less than $10^7$ Ω·cm was represented by Symbol Δ, a film having a resistivity of less than $10^9$ Ω·cm was represented by Symbol ○, and a film having a resistivity of $10^9$ Ω·cm or more was represented by Symbol □.

Further, evaluation of the durability for forming was made based on whether a mold is capable of forming products at a usable level or at a better level in a predetermined quantity. Symbol × represents a mold with which products in a predetermined quantity were not formed because of fusion-bonding of glass, cracking of glass, or the like. Symbol Δ represents a mold capable of forming products in a quantity similar to the predetermined one, and Symbol ○ represents a mold capable of forming products in a quantity equal to 1.5 times or more the predetermined one. Further, Symbol □ represents a mold capable of forming products in a quantity equal to two times or more the predetermined one.

As is seen from Table 3, by using a ta-C film encompassed by the present invention, the durability for forming of a mold becomes good. In contrast, in Comparative Examples 2 to 6, formability was good at the early stage of forming, but when the forming was repeated, peeling of the ta-C film formed on the ring-shaped mold partially started occurring from the vicinity of the aperture surface. As the peeling progressed, the fusion-bonding between the peeled ta-C film and glass used for forming was observed, cracking of formed products was observed, and the degradation of the durability for forming was observed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-127695, filed Jun. 3, 2010, and Japanese Patent Application No. 2011-087627, filed Apr. 11, 2011, which are hereby incorporated by reference herein in their entirety.

The invention claimed is:

1. A method of producing an optical element forming mold, the method comprising:

disposing a mold matrix in a film-forming chamber such that a holding member holds the mold matrix via insulating members, applying a voltage at a positive potential to the holding member so that the mold matrix is kept at a floating potential;

TABLE 3

|  | Magnet arrangement | Magnetic flux density at aperture portion [T] | Magnetic flux density in inner space of mold [T] | Potential of mold holding member [V] | Potential of mold matrix [V] | Resistivity [Ω] | Durability for forming |
|---|---|---|---|---|---|---|---|
| Example 3 | a | 0.002 | 0.025 | 30 | −30 | Δ | Δ |
| Example 4 | d | 0.01 | 0.1 | 35 | −25 | ○ | ○ |
| Example 5 | c | 0.02 | 0.2 | 10 | −40 | Δ | Δ |
| Example 6 | b | 0.015 | 0.05 | 100 | −50 | Δ | Δ |
| Example 7 | d | 0.01 | 0.03 | 50 | −10 | ○ | Δ |
| Example 8 | b | 0.01 | 0.04 | 30 | −100 | Δ | Δ |
| Example 9 | e | 0.008 | 0.04 | 50 | −30 | ○ | ○ |
| Example 10 | b | 0.005 | 0.05 | 50 | Floating | □ | □ |
| Example 11 | e | 0.005 | 0.03 | 20 | −90 | ○ | □ |
| Example 13 | a | 0.01 | 0.06 | 40 | −40 | □ | □ |
| Comparative Example 2 | Without magnet | Absent | Absent | 70 | −120 | Δ | × |
| Comparative Example 3 | Without magnet | Absent | Absent | 8 | −50 | × | × |
| Comparative Example 4 | a | 0.005 | 0.02 | 120 | −25 | × | × |
| Comparative Example 5 | c | 0.01 | 0.02 | 50 | 0 | Δ | × |
| Comparative Example 6 | e | 0.01 | 0.05 | 0 | −155 | × | × | forming a magnetic field in a substantially normal direction with respect to a film-forming surface of the mold matrix; and forming a tetrahedral amorphous carbon film on the film-forming surface of the mold matrix by using a filtered cathodic vacuum arc process while applying the voltage to the holding member.

2. The method according to claim 1, wherein:

the film-forming surface of the mold matrix has a convex or concave shape;

the holding member is disposed around the film-forming surface; and the magnetic field is formed so as to form a magnetic flux with a magnetic flux density of 0.003 tesla to less than 0.015 tesla toward a direction within ±30° with respect to the substantially normal direction of the film-forming surface of the mold matrix, thereby applying the voltage at a potential of +10 V to +100 V to the holding member.

3. A method of producing an optical element forming mold, the method comprising:

disposing a mold matrix in a film-forming chamber; and applying a voltage at a potential of +20 V to +100 V to a holding member so that the mold matrix is kept at a floating potential, or −100 V to 0 V, wherein:

the mold matrix has a ring shape, an inner peripheral surface of the mold matrix is a film-forming surface, the holding member is disposed around the inner peripheral surface, the holding member holds the mold matrix via insulating members, and a magnetic field is formed so as to form a magnetic flux with a magnetic flux density of 0.002 tesla to less than 0.015 tesla toward a direction within ±30° with respect to a substantially normal direction of the film-forming surface of the mold matrix, and a tetrahedral amorphous carbon film is formed on the film-forming surface of the mold matrix while applying the voltage to the holding member.

4. An optical element forming mold, which is produced by the method according to claim 1.

5. The method according to claim 1, wherein the film-forming surface of the mold matrix has a convex or concave shape.

6. The method according to claim 1, wherein the magnetic field is formed so as to form a magnetic flux with a magnetic flux density of 0.003 tesla to less than 0.015 tesla toward a direction within ±30° with respect to the substantially normal direction of the film-forming surface of the mold matrix.

7. The method according to claim 1, wherein the mold matrix includes internally a magnet.

* * * * *